US006751856B2

(12) United States Patent
Kedrowski et al.

(10) Patent No.: US 6,751,856 B2
(45) Date of Patent: Jun. 22, 2004

(54) METHOD FOR ELECTRICALLY CONNECTING A CIRCUIT BOARD CONNECTOR TO AN EXTERNAL DEVICE

(75) Inventors: Donald B. Kedrowski, Loveland, CO (US); Andrew S. Poulsen, Fort Collins, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/324,524

(22) Filed: Dec. 19, 2002

(65) Prior Publication Data

US 2003/0092300 A1 May 15, 2003

Related U.S. Application Data

(62) Division of application No. 09/766,029, filed on Jan. 19, 2001, now Pat. No. 6,524,123.

(51) Int. Cl.[7] .......................... H05K 3/30; H01R 13/60

(52) U.S. Cl. ............................ 29/832; 29/837; 29/842; 29/854; 29/845; 439/131

(58) Field of Search .......................... 29/741, 832, 837, 29/842, 854, 876, 748, 845; 174/260, 261; 439/354, 357, 358, 350, 327, 328, 131

(56) References Cited

U.S. PATENT DOCUMENTS

| | | | | | |
|---|---|---|---|---|---|
| 2,369,860 | A | | 2/1945 | Schroeder | |
| 3,994,552 | A | | 11/1976 | Selvin | |
| 4,083,619 | A | | 4/1978 | McCormick et al. | |
| 4,423,373 | A | | 12/1983 | LeCroy, Jr. | |
| 4,672,306 | A | | 6/1987 | Thong | |
| 4,694,245 | A | * | 9/1987 | Frommes | 324/754 |
| 4,708,661 | A | | 11/1987 | Morland et al. | |
| 4,734,050 | A | | 3/1988 | Negre et al. | |
| 4,959,021 | A | | 9/1990 | Byrne | |
| 5,015,947 | A | | 5/1991 | Chism | |
| 5,293,122 | A | | 3/1994 | Cake et al. | |
| 5,310,352 | A | | 5/1994 | Mroczkowski et al. | |
| 5,370,541 | A | * | 12/1994 | Bossard | 439/131 |
| 5,400,502 | A | * | 3/1995 | Ota et al. | 29/845 |
| 5,431,580 | A | | 7/1995 | Tabata | |
| 5,460,536 | A | | 10/1995 | Cullen | |
| 5,509,192 | A | * | 4/1996 | Ota et al. | 29/741 |
| 5,597,317 | A | | 1/1997 | Hansell, III et al. | |
| 5,613,870 | A | * | 3/1997 | Traver, Jr. | 439/352 |
| 5,730,605 | A | * | 3/1998 | Glusker et al. | 439/67 |
| 5,752,845 | A | | 5/1998 | Fu | |
| 5,782,645 | A | | 7/1998 | Stobie et al. | |
| 5,791,916 | A | | 8/1998 | Schirbl et al. | |
| 5,823,352 | A | | 10/1998 | Mena et al. | |
| 5,857,866 | A | | 1/1999 | Felps | |
| 6,146,210 | A | | 11/2000 | Cha et al. | |
| 6,165,009 | A | | 12/2000 | Anbo et al. | |

OTHER PUBLICATIONS

US 6,264,473, 7/2001, Bullinger et al. (withdrawn)

* cited by examiner

*Primary Examiner*—Carl J. Arbes
*Assistant Examiner*—Tai Van Nguyen

(57) ABSTRACT

A method for electrically connecting a circuit board connector to an external device. An embodiment of the method comprises providing a probe block through one end of a guide sleeve open on opposing ends, linking at least one contact on the probe block is linked to the external device, positioning the probe block so that the at least one contact is substantially aligned with a corresponding pin on the circuit board connector, and moving the probe block through the guide sleeve until the at least one contact makes a connection through one of the opposing open ends of the guide sleeve with the corresponding pin on the circuit board connector.

20 Claims, 8 Drawing Sheets

METHOD FOR ELECTRICALLY CONNECTING A CIRCUIT BOARD CONNECTOR TO AN EXTERNAL DEVICE

CROSS-REFERENCE TO RELATED APPLICATION

This is a divisional of U.S. patent application Ser. No. 09/766,029, filed on Jan. 19, 2001 now U.S. Pat. No. 6,524,123, for SELF-ALIGNING, QUICK-RELEASE CONNECTOR of Kedrowski, et al., which is hereby incorporated herein by reference for all that it discloses.

FIELD OF THE INVENTION

The invention pertains to circuit board connectors, and more specifically, to a method for electrically connecting a circuit board connector to an external device.

BACKGROUND OF THE INVENTION

Circuit boards are widely used for electronic devices. Often, a circuit board will include at least one connector for exchanging signals with another device or component. For example, the circuit board for a computer (i.e., the "mother board") typically includes several connectors that can be electrically connected to other devices (e.g., via a mating connector and a ribbon cable), such as, a hard disk drive, a floppy disk drive, a printer port, a serial port, etc.

During the design phase of a circuit board, a prototype is often assembled to test the design theory. A signaling device (e.g., test equipment) may be electrically connected to a connector on the prototype circuit board to test the function thereof, and make the necessary adjustments thereto. Likewise, during manufacture, it is often desirable to test the circuit board during or after manufacture and before shipping. Again, a signaling device may be electrically connected to a connector on the circuit board to test for proper assembly (e.g., for continuity at the solder connections).

One solution is to manually connect a mating connector directly to the connector on the circuit board that is electrically connected to a signaling device via a ribbon cable, or the like. However, connectors typically used on circuit boards have little or no alignment tolerance. Where the mating connector is misaligned, the connector on the circuit board may be damaged. For example, the pins may be bent where the operator forces a mating connector that is misaligned onto the connector on the circuit board. In addition, manually connecting the signaling device may otherwise cause damage to the circuit board connector, to other components on the circuit board, and/or to the circuit board itself. For example, the operator may apply an excessive force to the mating connector to make a connection with the connector on the circuit board. Such excessive force may cause the solder joints securing the connector to the circuit board to loosen. Likewise, the mating connector may strike another component, and/or crack or otherwise damage the circuit board itself. Therefore, the operator must patiently align the mating connector with the circuit board connector and then carefully make the connection therebetween. In addition, where the operator is using a test probe instead of a mating connector, the operator must make an even connection with each pin thereof and hold the test probe in place throughout the entire test. In any event, such manual testing requires skill, takes time, and may be fatiguing for the operator.

Another solution is to automatically connect the signaling device directly to the circuit board connector, again using a mating connector electrically connected to the signaling device with a ribbon cable, or the like. Typically, an automated "arm" mechanism, or the like, presses the mating connector in place to make the connection thereto, and then lifts the arm away after testing the device. As such, a consistent force is applied evenly over the connector on the circuit board. In addition, the automated process reduces human involvement and the problems inherent therewith. However, the mating connector must still be properly aligned before it can be connected to the connector on the circuit board. Even a slight misalignment between the mating connector and the circuit board could cause damage to the connector on the circuit board, to other components, or to the circuit board itself. In addition, a misaligned connection may result in an improper connection, causing a short and/or failure to accurately test the device.

Furthermore, during either manual or automatic testing, the circuit board connector is prone to wear and damage during insertion and removal of the mating connector. The circuit board connector pins may become bent or broken. In addition, misalignment can result in short circuits or probing the wrong signal.

SUMMARY OF THE INVENTION

An embodiment of a method for electrically connecting a circuit board connector to an external device may comprise: providing a probe block through one end of a guide sleeve open on opposing ends; linking at least one contact on the probe block to the external device; positioning the probe block so that the at least one contact is substantially aligned with a corresponding pin on the circuit board connector; and moving the probe block through the guide sleeve until the at least one contact makes a connection through one of the opposing open ends of the guide sleeve with the corresponding pin on the circuit board connector.

BRIEF DESCRIPTION OF THE DRAWINGS

Illustrative and presently preferred embodiments of the invention are illustrated in the drawings in which.

DESCRIPTION OF THE PREFERRED EMBODIMENT

A self-aligning, quick release connector 10 according to one preferred embodiment of the invention is shown and described herein for automatically and/or manually making an electrical connection between a circuit board connector 20 and one or more external devices (e.g., an electrical signal generator, radio frequency (RF) signal generator, test instrument, etc.). The connector 10 therefore may be used as a convenient way to connect to the circuit board 25 to allow the same to be tested.

Figure 1:
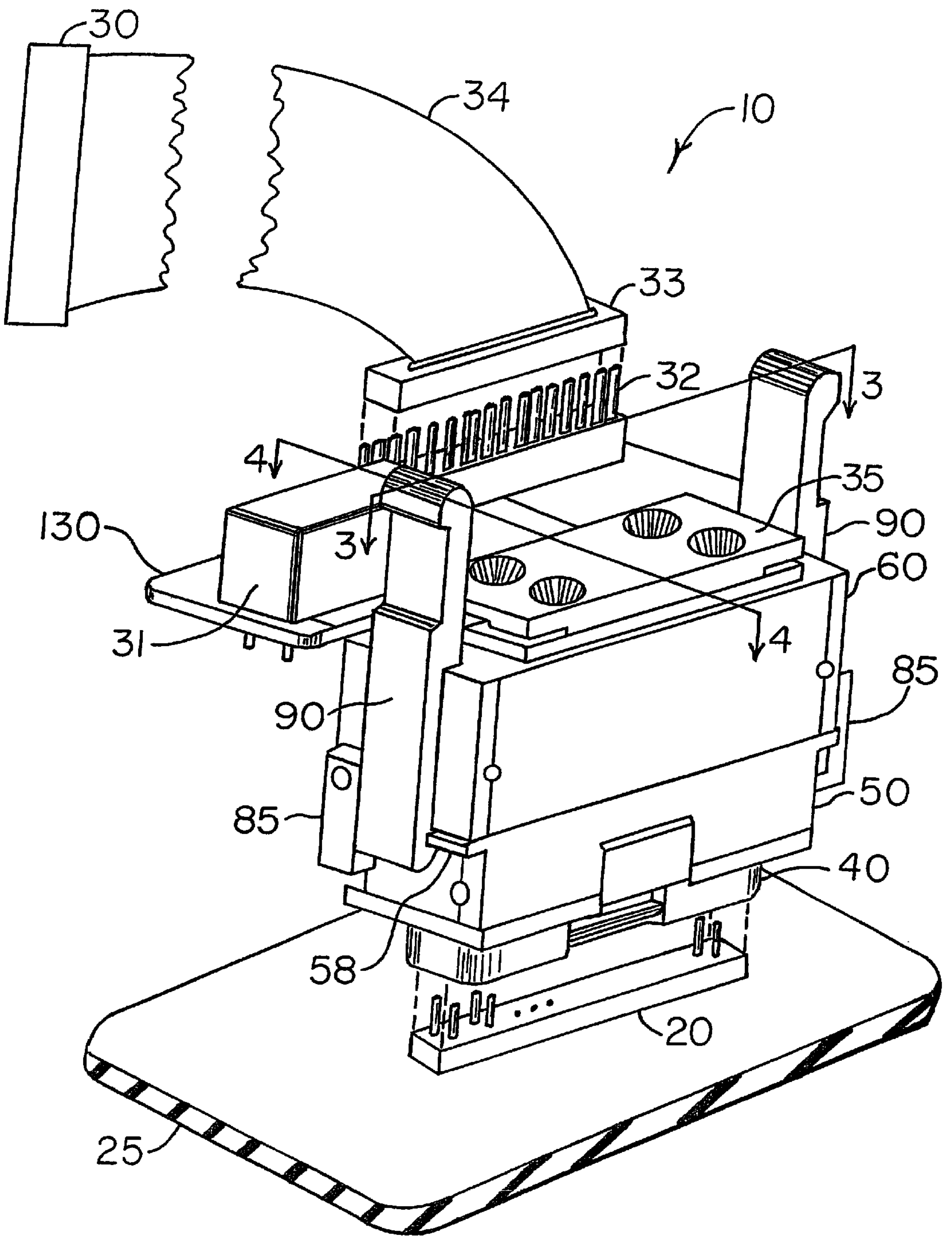
FIG. 1 is a perspective view of one embodiment of the self-aligning, quick release connector.
Figure 2:
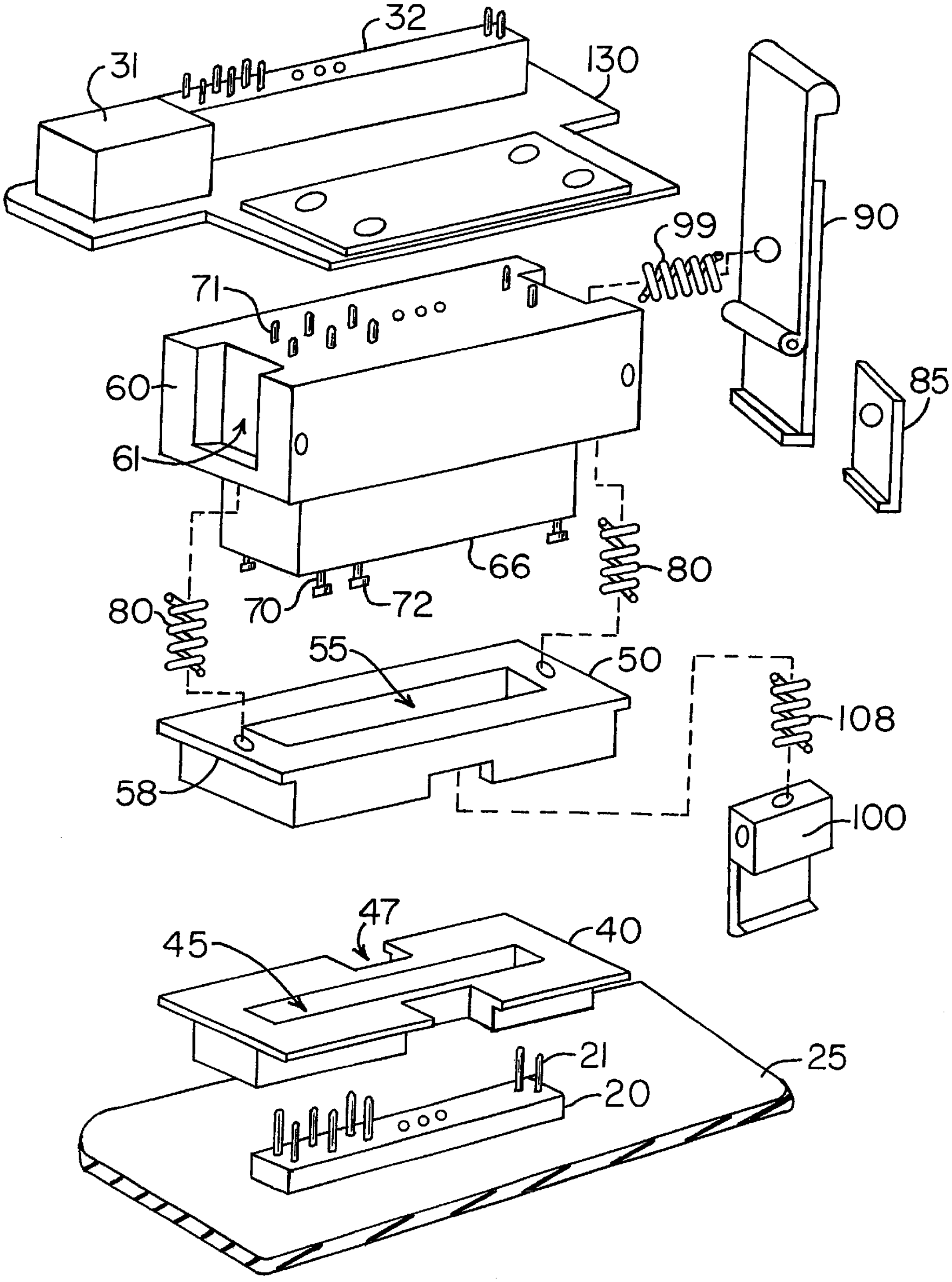
FIG. 2 is an exploded view of the connector showing the various components thereof.

Referring now primarily to FIG. 1 and FIG. 2, one embodiment of the self-aligning, quick-release connector 10 may comprise a plurality of components configured and arranged to allow the connector 10 to be readily connected to and disconnected from the circuit board connector 20 provided on the circuit board 25. The connector 10 may comprise a probe block 60 having one or more contacts 70 therein and electrically connected at one end to the signaling device 30. Preferably, the contact 70 is a "pogo" pin (i.e., a pin having a spring-biased tip 72). As such, where an uneven force is applied to the pogo pin, the contact 70 still makes an even connection with the circuit board connector 20. In addition, the use of a pogo pin reduces wear and potential damage to the circuit board connector 20 as only the tip of the pogo pin 70 need come into contact with the circuit board connector 20 to make a connection therebetween. The probe block 60 may be moved between a retracted position 62 and an extended position 64 within an interior chamber 55 formed in the guide sleeve 50. Preferably, the connector 10 comprises an alignment sleeve 40 for fitting about the circuit board connector 20. The alignment sleeve 40 may be attached to a guide sleeve 50 and preferably has a tapered or beveled chamber 45 formed therein, thus increasing the tolerance for aligning and fitting the alignment sleeve 40 about the circuit board connector 20.

In use, the contact 70 may be recessed within the guide sleeve 50 when the probe block 60 is in the retracted position 62 so that any misalignment can be corrected using the alignment sleeve 40 and the connector 10 may be properly aligned before making a connection with the circuit board connector 20. As such, there is a reduced likelihood of shorting or otherwise damaging the circuit board connector 20. Preferably, a spring member 80 is juxtaposed between the guide sleeve 50 and the probe block 60 for resiliently biasing the probe block 60 in the retracted position 62 so that the connector 10 can be aligned over the circuit board connector 20 without having to separately move the probe block 60 into the retracted position 62. Once the connector 10 is aligned with the circuit board connector 20 (i.e., the alignment sleeve 40 is fitted thereabout), the probe block 60 may be moved within the chamber 55 into the extended position 64 (i.e., toward the circuit board connector 20) so that the contact 70 makes a connection with the circuit board connector 20. A signaling device 30 may be electrically connected to the circuit board connector 20. As such, a connection is made between the circuit board connector 20 and the signaling device 30 for test or for otherwise making a permanent or semi-permanent connection thereto.

Preferably, the connector 10 also comprises a clip member 85 attached to the probe block 60. The clip member 85 engages a lip 58 formed on the guide sleeve 50 when the probe block 60 is in the retracted position 62. As such, the probe block 60 and the guide sleeve 50 are retained together against the biasing force of the spring member 80 juxtaposed between the guide sleeve 50 and the probe block 60.

The connector 10 may further comprise a latch member 90 pivotally connected to the probe block 60 for releasably engaging the guide sleeve 50 when the probe block 60 is in the extended position 64. As such the probe block 60 may be secured in the extended position 64 during test or for a permanent or semi-permanent connection to the circuit board connector 20. Preferably, the latch member 90 is resiliently biased in a closed position 96 for engaging the guide sleeve 50 when the probe block 60 is in the extended position 64. The latch member 90 may be released when an opposing force 92 is applied to an upper portion 95 thereof, so that the probe block 60 may move into the retracted position 62.

The connector 10 may further comprise a coupling member 100 pivotally connected to the guide sleeve 50. The coupling member 100 may releasably engage a housing 110 surrounding at least a portion of the circuit board connector 20 when the probe block 60 is in the extended position 64, thereby securing the connector 10 to the housing 110. Preferably, the coupling member 100 is resiliently biased in an open position within a recess 47 formed in the alignment sleeve 40. As such, the coupling member 100 may be pivoted outward from the recess 47 by the probe block 60 as the probe block 60 is moved into the extended position 64 to engage the housing 110. In addition, the coupling member 100 may be pivoted back into the recess 47 as the probe block 60 is moved into the retracted position 62 to release from the housing 110.

To illustrate using the connector 10, the connector 10 may be aligned with and fitted about the circuit board connector 20 (e.g., using alignment sleeve 40). The probe block 60 may then be guided from the retracted position 62 (e.g., within the guide sleeve 50) into the extended position 64. As such, the contact 70 is in a recessed position during alignment, reducing the likelihood of a premature and/or erroneous connection. The contact 70 then makes a connection with the circuit board connector 20 when the probe block 60 is moved into the extended position 64. Preferably, the probe block 60 is latched in the extended position 64, and the connector 10 is coupled to a housing 110 at least partially surrounding the circuit board connector 20 to maintain the connection between the circuit board connector 20 and the connector 10.

It is important to recognize that the connector 10 readily aligns with the circuit board connector 20 and is not dependant on operator skill. As such, the connector 10 can be operated manually, saving time and reducing the likelihood of damage to the circuit board connector 20. In addition, the connector 10 can be automatically aligned without manual intervention, making it particularly suitable for automated use. The connector 10 also preferably locks in place and releases with a single spring-loaded action to self-eject when released, thus avoiding operator fatigue. The connector 10, whether for manual or automatic use, reduces the cycle time for testing circuit board connectors 20. In addition, the connector 10 reduces the likelihood of wear and potential damage to the circuit board connector 20 through the use of spring-loaded probes (e.g., pogo pins). In addition, the recessed contacts allow for alignment before making an electrical connection, thus eliminating short circuits or premature connections. Likewise, the invention prevents damage to the circuit board connector 20 and/or other components on the circuit board. That is, the connector 10 is properly aligned and the circuit board connector 10 is not forced, bent, worn, or otherwise damaged. In addition, the connector 10 can be used for testing a circuit board connector 20, or for otherwise making a permanent or semi-permanent connection thereto.

Having generally described the self-aligning, quick-release connector 10, and several advantages thereof, several embodiments of the invention will now be described in further detail.

FIG. 1 is a perspective view of one embodiment of the self-aligning, quick-release connector 10. The individual components of the connector 10 can be seen in the exploded view of FIG. 2. It is noted that several opposing components (e.g., the latch member 90, the clip member 85, and the coupling member 100), and the associated components (e.g., spring 99, spring 108) are not shown in FIG. 2. However, it is understood that these components are substantially identical to those shown.

The connector 10 may comprise a probe block 60 having at least one contact 70 therein (e.g., extending beyond a lower portion 66 thereof). The contact 70 is preferably inserted through or molded within the entire length of the probe block 60 and extends beyond each end of the probe block 60 (e.g., FIG. 3). However, it is understood that in another embodiment, the contact may be recessed within the probe block 60. A guide sleeve 50 has an interior chamber 55 formed therein for receiving the probe block 60. The probe block 60 may be moved between a retracted position 62 (e.g., FIG. 3) and an extended position 64 (e.g., FIG. 5) within the interior chamber 55 formed in the guide sleeve 50 to make a connection between the contact 70 and the circuit board connector 20. The connector 10 preferably comprises an alignment sleeve 40 attached to the guide sleeve 50. The alignment sleeve 40 has an interior chamber 45 formed therein for fitting about the circuit board connector 20. The top portion 71 of the contact 70 may be electrically connected to an interface board or plate 130 (e.g., a printed circuit board) having a source connector thereon (e.g., RF coaxial cable connector 31, pin connector 32). The source connector 31, 32 may be electrically connected to an external device (e.g., signaling device 30) via a mating connector 33 and ribbon cable 34 combination, a coaxial cable (not shown) with suitable fittings, etc. Preferably, a cover plate 35 is provided to cover the upper portion 71 of the contact 70, for example, to manually depress the probe block 60 into the extended position 64.

In use, the contact 70 is recessed within the guide sleeve 50 (FIG. 3) when the probe block 60 is in the retracted position 62 so that any misalignment can be corrected using the alignment sleeve 40 before making a connection with the circuit board connector 20. Once the connector 10 is aligned with the circuit board connector 20 (i.e., using the alignment sleeve 40), the probe block 60 may be moved within the chamber 55 formed within the guide sleeve 50 into the extended position 64 (i.e., toward the circuit board connector 20) so that the contact 70 makes a connection (FIG. 5) with the circuit board connector 20 (e.g., with the desired or corresponding pin(s) 21 thereof). Once a connection is made between the contact 70 and the circuit board connector 20, a signal (e.g., an electrical signal, RF signal, etc.) can be applied to and/or received from the circuit board connector 20 for test, or for a permanent or semi-permanent connection with the device (e.g., the circuit board 25).

In a preferred embodiment, a spring member 80 is juxtaposed between the guide sleeve 50 and the probe block 60 for resiliently biasing the probe block 60 in the retracted position 62 so that the connector 10 can be aligned over the circuit board connector 20 without first having to move the probe block 60 into the retracted position 62. Also preferably, the connector 10 comprises a clip member 85 attached to the probe block 60. The clip member 85 engages a lip 58 formed on the guide sleeve 50 when the probe block 60 is in the retracted position 62. As such, the probe block 60 and the guide sleeve 50 are retained together as a single unit against the biasing force of the spring member 80 juxtaposed between the guide sleeve 50 and the probe block 60.

Also in a preferred embodiment, the contact 70 is a "pogo" pin (i.e., a pin having at least one spring-biased tip). As such, even where an uneven force is applied to the contact 70, the contact 70 will still make an even connection with the circuit board connector 20 and will reduce wear and potential damage to the circuit board connector 20. Likewise, the head 72 of the contact 70 is preferably enlarged, as shown, to provide a larger surface area for making a connection with the pins 21 of the circuit board connector 20. However, any suitable contact may be used under the teachings of the invention. In addition, it is understood that the connector 10 includes at least one contact 70, and may include as many contacts 70 as necessary to make a connection with each pin on the circuit board connector 20 requiring the connection to receive and/or output a signal. Preferably, the contact 70 extends through the probe block 60 (FIG. 3) and beyond the probe block 60 on either end thereof. However, it is understood that the contact 70 may be recessed within the probe block 60. It is also understood that the contact 70 may be wired or otherwise linked through the probe block 60 to the signaling device 30. Also in a preferred embodiment, the contact 70 is a double-ended pogo pin. As such, the plate 130 can be affixed atop the probe block 60 and linked to the upper portion 71 of the contact 70 without the need for soldering the contact 70 to the printed circuit thereon. Such an embodiment allows for quick and simple replacement of the plate 130.

It is to be understood that the connector 10 can be used with any suitable signaling device 30 (e.g., electric, RF, or otherwise). In addition, the signaling device 30 may include a device for receiving output (e.g., electronic test equipment) from the one or more of the pins on the circuit board connector 20. It is understood that the signaling device 30 may be electrically connected to the connector 10 via any suitable connection (e.g., ribbon cable, coaxial cable, etc.), or soldered or otherwise directly attached to the plate 130. In addition, the signaling device 30 may be directly linked to the upper portion 71 of the contact 70. In such an embodiment, the plate 130 may be omitted.

Preferably, the chamber 45 formed within the alignment sleeve 40 is formed substantially to fit about the circuit board connector 20 and may be tapered or beveled (e.g., FIG. 4), thus increasing the tolerance for aligning and fitting the alignment sleeve 40 about the circuit board connector 20. Also in a preferred embodiment, the chamber 55 formed within the guide sleeve 50 is larger than the chamber 45 formed within the alignment sleeve 40. The probe block 60 thus moves freely through the chamber 55 formed within the guide sleeve 50 and is stopped by the chamber 45 formed within the alignment sleeve 40. As such, the probe block 60 is prevented from being forced onto the circuit board connector 20, thereby causing damage to the circuit board connector 20 or the circuit board itself. However, it is understood that the chambers 45 and 55 formed within the alignment sleeve 40 and the guide sleeve 50, respectively, can be any suitable size for aligning the contact 70 of the connector 10 with the circuit board connector 20 and guiding the probe block 60 so that the contact 70 makes a connection with the circuit board connector 20.

Also preferably, the alignment sleeve 40 is made of a non-conductive, static-dissipative material (e.g., DuPont DELRIN® acetyl resin; G10/FR4 available from Current Inc., East Haven, Conn.; etc.) so that the circuit board connector 20 and/or other components are not shorted or otherwise damaged in the event that the alignment sleeve 40 makes contact therewith. It is understood however, that the alignment sleeve 40 may be made of any suitable material.

The alignment sleeve 40 and the guide sleeve 50 are preferably manufactured separately and attached to one another for use. As such, the alignment sleeve 40 may be made from a non-conductive, static-dissipative material to protect the circuit board connector 20, other components, and the circuit board itself (e.g., against short circuiting). Likewise, the guide sleeve 50 is preferably made of a strong, durable material, such as steel or aluminum, or the like. The alignment sleeve 40 and the guide sleeve 50 may be attached to one another using any suitable means, such as, but not limited to, connecting pins, screw, glue, snaps, etc. However, it is understood that the alignment sleeve 40 and the guide sleeve 50 may also be molded as a single unit.

It is also understood that the probe block 60 is preferably made of a non-conductive, static-dissipative material to reduce the likelihood of buildup of electrostatic charge therein, and so that the contacts 70 do not short across one another. However, it is to be understood that other suitable materials may be used under the teachings of the invention. According to design considerations, the probe block 60 may even be made from a conductive material, for example, where only a single contact 70 is used, or where multiple contacts are individually insulated or sheathed within a non-conductive material.

The connector 10 may further comprise a latch member 90 pivotally connected to the probe block 60 (e.g., in recess 61 formed therein) for releasably engaging the guide sleeve 50 (e.g., with lip 91 of latch member 90) when the probe block 60 is in the extended position 64. As such the probe block 60 is secured in the extended position 64 during test or for a permanent or semi-permanent connection to the circuit board connector 20. Preferably, the latch member 90 is resiliently biased in a closed position 96 for engaging the guide sleeve 50 when the probe block 60 is in the extended position 64. The latch member 90 is released when an opposing force 92 (FIG. 5) is applied to an upper portion 95 thereof, so that the probe block 60 may move into the retracted position 62, as shown and described in more detail below.

The latch member 90 is preferably made of a strong, durable material, such as steel, aluminum, or the like. As such, the latch member 90 is less subject to wear. However, it is understood that the latch member 90 may be made from any suitable material. In addition, the latch member 90 may include more than one lip 91 for engaging the probe block 60. As such, the probe block 60 may be moved within the guide sleeve 50 to varying degrees so that the connector 10 is further adjustable (e.g., for various height pins on various circuit board connectors 20).

The connector 10 may also comprise a coupling member 100 pivotally connected to the guide sleeve 50. The coupling member 100 may releasably engage a housing 110 (FIG. 6) surrounding at least a portion of the circuit board connector 20 when the probe block 60 is in the extended position 64. As such, the connector 10 is secured to the housing 110 (e.g., during test or for making a permanent or semi-permanent connection). Preferably, the coupling member 100 is resiliently biased within a recess 47 formed in the alignment sleeve 40. As such, the coupling member 100 may be pivoted outward from the recess 47 as the probe block 60 is moved into the extended position 64 to engage the housing 110. In addition, the coupling member 100 may be pivoted back into the recess 47 as the probe block 60 is moved into the retracted position 62 to release from the housing 110, as shown and described in more detail below.

Figure 3:
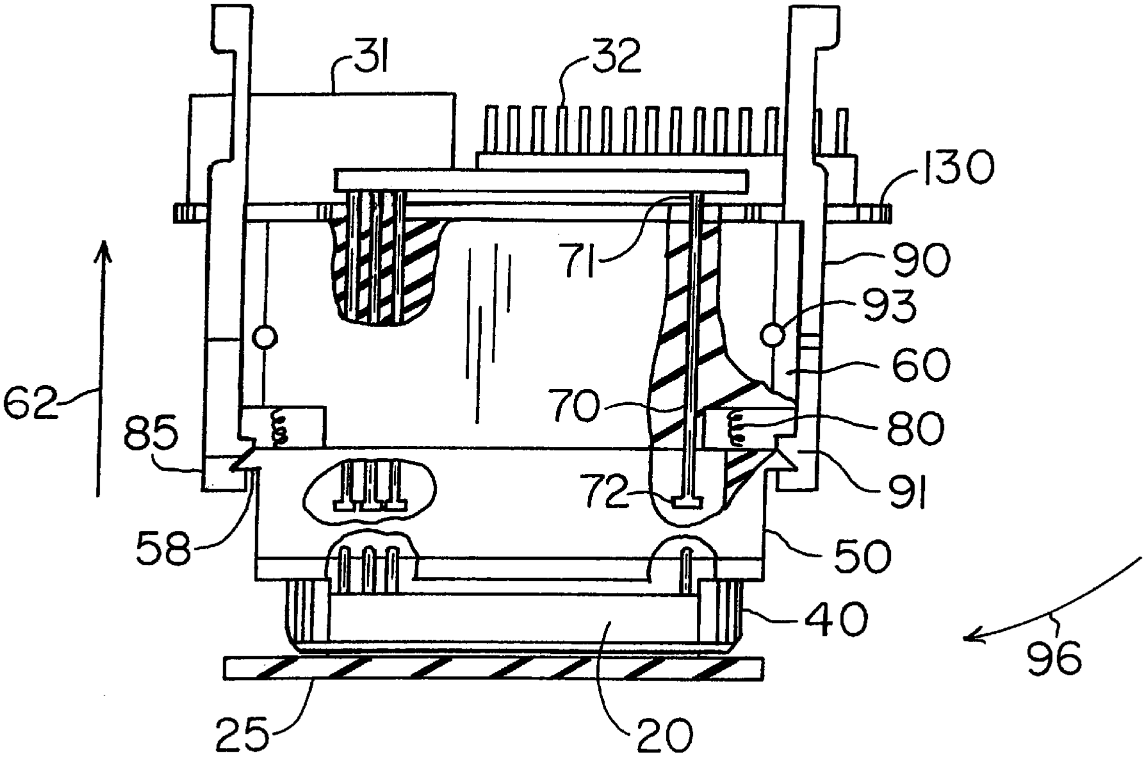
FIG. 3 is a partial cross-sectional view of the front of the connector, taken along lines 3—3 in FIG. 1, and shown fitted about a circuit board connector, wherein the contact is recessed within the guide sleeve of the connector.
Figure 4:
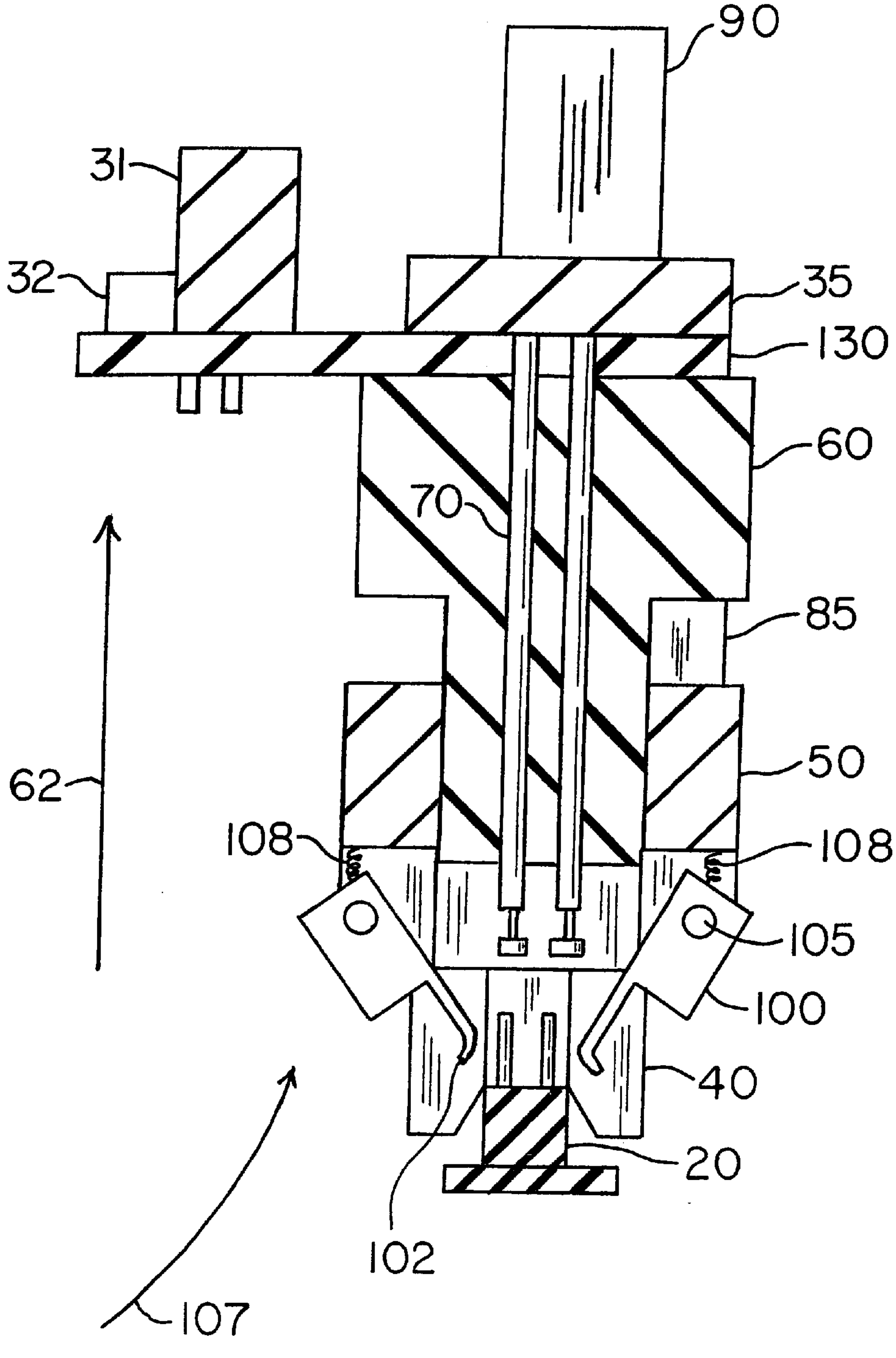
FIG. 4 is a cross-sectional view of the side of the connector, taken along lines 4—4 in FIG. 1, and shown fitted about the circuit board connector, wherein the contact is recessed within the guide sleeve of the connector.

FIG. 3 is a partial cross-sectional view of the front of the connector 10, taken along line 3—3 of FIG. 1, and shown fitted about the circuit board connector 20, wherein the contacts 70 are recessed within the chamber 55 formed in the guide sleeve 50. FIG. 4 is a cross-sectional view of the side of the connector 10, taken along line 4—4 of FIG. 1, and also shown fitted about the circuit board connector 20 with the contacts 70 recessed within the chamber 55 of the guide sleeve 50. That is, in FIG. 3 and FIG. 4, the probe block 60 is shown in the retracted position 62. Preferably, the probe block 60 is biased in the retracted position 62 by spring members 80 juxtaposed between the probe block 60 and the guide sleeve 70, as explained above.

Also in FIG. 3 and FIG. 4, where the probe block 60 is in the retracted position 62, the clip member 85 is shown latched to the lip 58 to retain the probe block 60 and the guide sleeve 50 together as a single unit (e.g., as shown in FIG. 1). In addition, in FIG. 3 the latch member 90 is shown pivotally connected at 93 to the probe block 60 (e.g., with a pin, or the like) and biased in a closed position 96 (e.g., by spring member 99 shown in FIG. 2). That is, the lower portion 91 of the latch member 90 is biased toward the probe block 60 in the direction of arrow 96.

Also, in FIG. 4 the coupling member 100 is shown pivotally connected at 105 to the guide sleeve 50 (e.g., with a pin, or the like), and resiliently biased in an open position 107. That is, the lower portion 102 of the coupling member 100 is biased within the recess 47 formed in the alignment sleeve 40 (FIG. 2).

Preferably, the latch member 90 is resiliently biased in the closed position 96 as shown in FIG. 3 by a spring member 99 (FIG. 2) juxtaposed between the latch member 90 and the probe block 60 above the pivot 93. Also preferably, the coupling member 100 is resiliently biased in the open position 107 by a spring member 108 juxtaposed between the coupling member 100 and the guide sleeve 50 above the pivot 105. However, it is understood that any suitable means for resiliently biasing the latch member 90 and the coupling member 100 may be used under the teachings of the invention. For example, the respective pivots 93 and 105 may be spring loaded. Indeed, in other embodiments, the latch member 90 and the coupling member 100 need not be resiliently biased.

Figure 5:
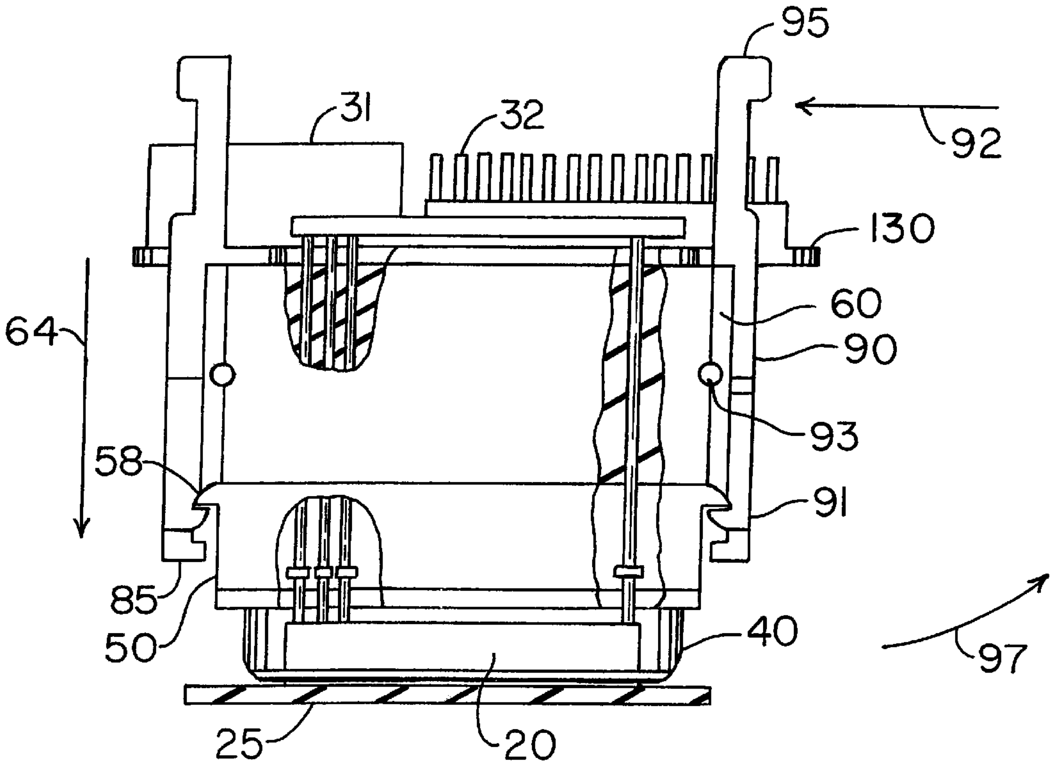
FIG. 5 is a partial cross-section view of the front of the connector, as in FIG. 3, wherein the contact is making a connection with the circuit board connector.
Figure 6:
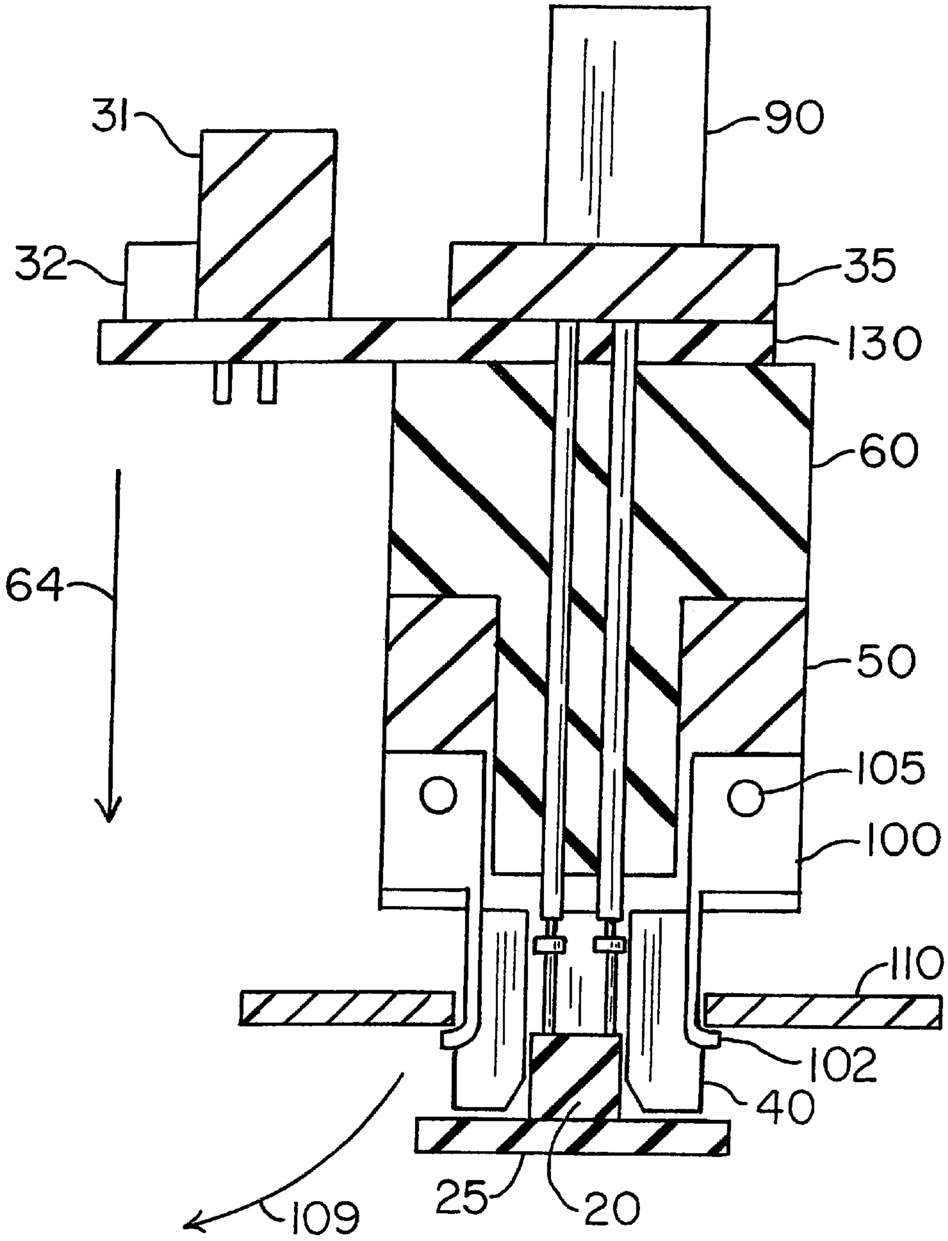
FIG. 6 is a cross-sectional view of the side of the connector, as in FIG. 4, wherein the contact is making a connection with the circuit board connector.

FIG. 5 is a partial cross-sectional view of the front of the connector 10, as in FIG. 3, shown fitted about the circuit board connector 20, wherein the probe block 60 has been moved within the guide sleeve 50 into the extended position 64. FIG. 6 is a cross-sectional view of the side of the connector 10, as in FIG. 4, also shown fitted about the circuit board connector 20 with the probe block 60 moved within the guide sleeve 50 into the extended position 64. As such, in both FIG. 5 and FIG. 6, the contacts 70 are shown making a connection with the circuit board connector 20.

Also in FIG. 5, where the probe block 60 is in the extended position 64, the clip member 85 is shown drawn down and away from the lip 58, as the probe block 60 is moved within the guide sleeve 50. In addition, the lower portion 91 on latch member 90 is shown having “snapped” past the lip 58 on the guide member 50 and biased in a closed position 96 (FIG. 3) about the guide sleeve 50 to retain the probe block 60 in the extended position 64. That is, the the latch member 90 may be pivoted outward about the pivot 93 in the direction of arrow 97 to allow the lower portion 91 of the latch member 90 to pass the lip 58 on the guide member 50. The latch member 90 then pivots inward (e.g., by the resilient force applied by the spring 99, in FIG. 2) in the direction of arrow 96 (FIG. 3) to bias the latch member 90 against the guide member 50 to engage the lip 58 thereon.

As such, the latch member 90 maintains the probe member 60 in the extended position 64 (i.e., with the contacts 70 making a connection with the circuit board connector 20). The latch member 90 may be released by applying an opposing force 92 to an upper portion 95 thereof. As such, the lower portion 91 of the latch 90 releases from the lip 58 formed on the guide sleeve 50 and the probe block 60 moves into the retracted position 62 (e.g., under the biasing force of the spring 80, in FIG. 2 and FIG. 3).

Also in FIG. 6, the coupling member 100 is shown having moved to an open position 109 to engage the housing 110 at least partially surrounding the circuit board connector 20. That is, as the probe block 60 moves within the chamber 55 formed within the guide sleeve 50 (FIG. 2), the probe block 60 biases against the coupling member 100 and pivots it outward from the recess 47 formed in the alignment sleeve 40 (FIG. 2) in the direction of arrow 109. The coupling member 100 engages the housing 110 with the lower portion 102 and thus maintains the connector 10 in connection with the circuit board connector 20 (i.e., with the contacts 70 making a connection with the circuit board connector 20). The coupling member 100 may be pivoted into the recess 45 in the direction of arrow 107 (FIG. 4) as the probe block 60 is moved back into the retracted position 62 to release from the housing 110 (e.g., under the biasing force of spring 108, in FIG. 4).

Figure 7:
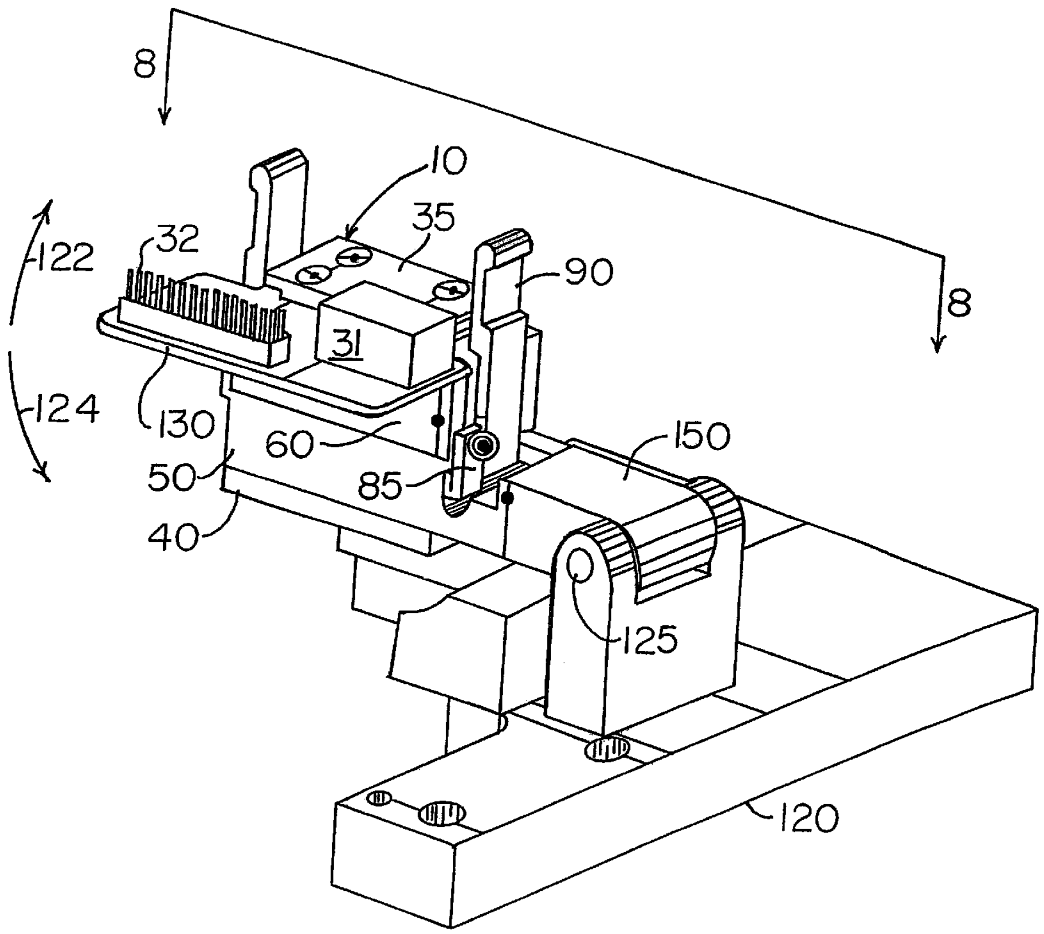
FIG. 7 is a perspective view of another embodiment of the self-aligning, quick release connector.
Figure 8:
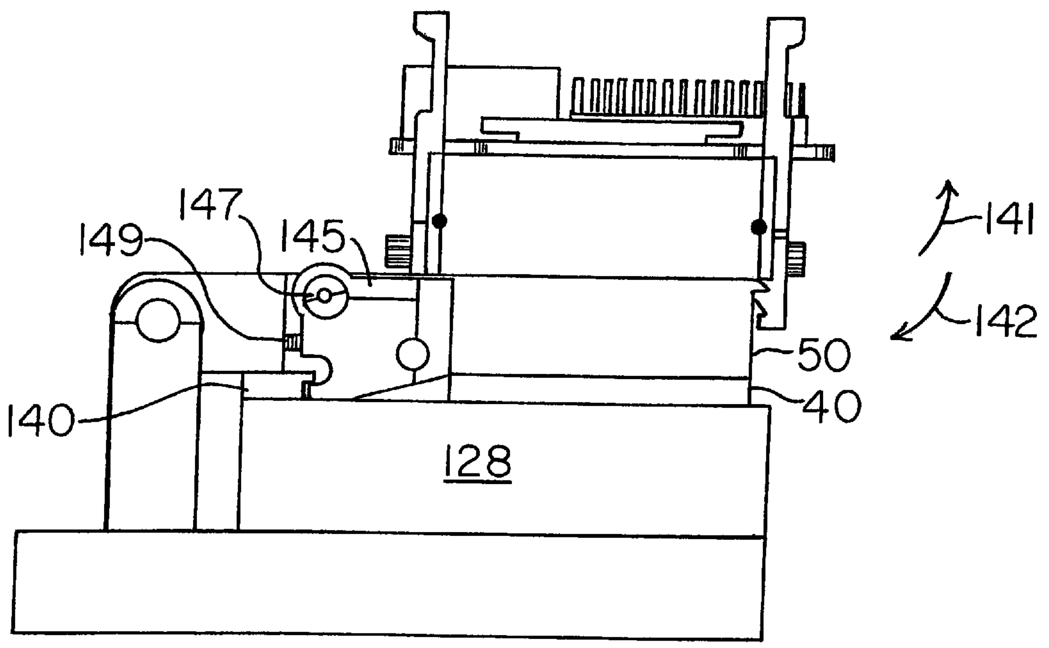
FIG. 8 is a rear view of the embodiment of the connector shown in FIG. 7, taken along lines 8—8.

Another embodiment of the connector 10 is shown in FIG. 7 and FIG. 8, preferably for use where the circuit board connector 20 is not at least partly surrounded by a housing 110 to be engaged by the coupling member 100, as described above with respect to FIG. 4 and FIG. 6. According to this embodiment of the invention, the connector 10 may include a base member 120. An arm 150 of the guide sleeve 50 may be pivotally connected to the base member 120 at pivot 125 so that the connector 10 may pivot thereabout between an open position 122 and a closed position 124. The base member 120 may be positioned over or adjacent the circuit board (not shown) so that the circuit board connector 20 is received within the base member 120 when the connector 10 is in the open position 122. That is, a corner of the circuit board can be positioned adjacent the two arms of the base member 120 that form an "L" shape. It is understood, however, that the base member 120 can be any suitable form for positioning the connector 10 for alignment with the circuit board connector 20. For example, the base member 120 may be formed to be positioned alongside the circuit board or otherwise near the circuit board connector 20. Or for example, the base member 120 may comprise an extension member 128 for adjusting the height of the connector 10 over the circuit board connector 20. Other embodiments are also contemplated under the teachings of the invention. In any event, once positioned, the arm 150 of the guide sleeve 50 is pivoted into the closed position 124 and the alignment sleeve 40 may be used to align the connector 10 with the circuit board connector 20. Again, the probe block 50 is moved into the extended position 64 so that the contact 70 connects with the circuit board connector 20, as discussed above.

Preferably, the base member 120 comprises a clip member 140 mounted thereon, and a coupler 145 is pivotally mounted at 147 on the guide sleeve 50 (or the arm 150 thereof) to move between an "unlocked" position 141 and a "locked" position 142, as shown in FIG. 8. The coupler 145 may thus engage the clip member 140 when the connector 10 is in the closed position 124 to secure the arm 150 of the guide sleeve 50 to the base member 120 and retain the connector 10 over and aligned with the circuit board connector 20.

Also preferably, the coupler 145 is resiliently biased in the unlocked position 141 by a spring member 149 biased between the coupler 145 and the arm 150 of the guide sleeve 50 below the pivot 147 (e.g., on a notch formed thereon). As such, when the probe block 60 is depressed (e.g., moved downward into the extended position), an edge thereof presses against the coupler 145 so that it pivots (e.g., about 147) into the locked position 142. However, it is understood that the coupler 145 may be resiliently biased in the unlocked position 141 using any suitable means, such as, but not limited to, a coil spring mounted about the pivot 147. Alternatively, the coupler 145 need not be resiliently biased in the unlocked position 141, and may instead be biased in the locked position 142. Or for example, the coupler 145 need not be resiliently biased at all, and may "fall" into the locked position 142 as the guide arm 150 is moved into the closed position 124.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method for electrically connecting a circuit board to an external device, comprising:

electrically connecting at least one contact in a probe block of a self-aligning connector to the external device;

positioning said at least one contact in said probe block in substantial alignment with a corresponding at least one pin on the circuit board, wherein said at least one contact is in a recessed position within an opening defined through a guide sleeve of the self-aligning connector away from said corresponding at least one pin on the circuit board during this step of positioning said at least one contact in substantial alignment with a corresponding at least one pin; and guiding the at least one contact in said probe block through the opening in the guide sleeve of the self-aligning connector toward the circuit board until said at least one contact makes a connection through the opening in said guide sleeve with said corresponding at least one pin on the circuit board.

2. The method of claim 1, further comprising fitting an alignment sleeve attached to said guide sleeve about a corresponding connecting apparatus on the circuit board.

3. The method of claim 1, further comprising latching said probe block to said guide sleeve to maintain said probe block in an extended position when the at least one contact makes the connection with said corresponding at least one pin on the circuit board.

4. The method of claim 1, further comprising latching said probe block to a housing on the circuit board which is at least partially surrounding a corresponding connecting apparatus on the circuit board.

5. The method of claim 1, further comprising self-ejecting said probe block from its connection to the circuit board.

6. The method of claim 1, further comprising conducting at least one signal through said at least one contact between the circuit board and the external device.

7. The method of claim 1, wherein guiding the at least one contact in said probe block through said guide sleeve comprises automatic depression of said probe block.

8. The method of claim 1, wherein guiding the at least one contact in said probe block through said guide sleeve comprises manually depressing said probe block.

9. A method for electrically connecting a circuit board to an external device, comprising:

providing at least one contact connected to a probe block of a self-aligning connector;

said at least one contact being disposed to move in an opening defined through a guide sleeve of the self-aligning connector;

electrically connecting at least one contact of said probe block to the external device;

positioning said probe block so that said at least one contact is substantially aligned with a corresponding at least one pin on the circuit board; and moving said at least on contact of said probe block through said guide sleeve until said at least one contact makes a connection through the opening through said guide sleeve with said corresponding at least one pin on the circuit board.

10. The method of claim 9, further comprising maintaining said at least one contact in a recessed position away from said corresponding at least one pin on said circuit board during positioning of said probe block.

11. The method of claim 9, further comprising fitting an alignment sleeve attached to said guide sleeve about a corresponding connecting apparatus on the circuit board.

12. The method of claim 9, further comprising maintaining said probe block in an extended position when the at least one contact makes the connection with said corresponding at least one pin on the circuit board.

13. The method of claim 9, further comprising self-ejecting said probe block from its connection to the circuit board.

14. The method of claim 9, further comprising releasably engaging a housing on the circuit board which is at least partially surrounding a corresponding connecting apparatus on the circuit board.

15. The method of claim 9, further comprising conducting at least one test signal through said at least one contact between the circuit board and the external device.

16. A method for electrically connecting a self-aligning connector to a circuit board, comprising:

positioning at least one contact connected to a probe block of a self-aligning connector in substantial alignment with a corresponding at least one electrical communication point on the circuit board, wherein an alignment sleeve of the self-aligning connector coacts with a physical feature on the circuit board to align the at least one contact with the at least one electrical communication point, and wherein the at least one contact is disposed in a recessed position within an opening defined through a guide sleeve of the self-aligning connector away from said corresponding at least one electrical communication point on the circuit board during the aligning of the at least one contact in substantial alignment with the corresponding at least one electrical communication point; and moving the at least one contact through the opening in the guide sleeve, said opening providing for the guided movement of the at least one contact so that the at least one contact makes an electrical connection with the corresponding at least one electrical communication point on the circuit board.

17. A method according to claim 16 wherein the alignment sleeve is connected to the guide sleeve of the self-aligning connector.

18. A method according to claim 16 wherein the probe block is movable within the opening defined through the guide sleeve to provide the guided movement of the at least one contact in the guide sleeve.

19. A method according to claim 16 further comprising maintaining said probe block in an extended position when the at least one contact makes the connection with said corresponding at least one electrical communication point on the circuit board.

20. A method according to claim 16, further comprising releasably engaging a housing on the circuit board which is at least partially surrounding a corresponding connecting apparatus on the circuit board.

* * * * *